US012772792B2

(12) United States Patent
An et al.

(10) Patent No.: US 12,772,792 B2
(45) Date of Patent: Oct. 20, 2026

(54) SYSTEM FOR MONITORING PERFORMANCE OF ELECTROSTATIC CHUCKS IN SUBSTRATE PROCESSING SYSTEMS

(71) Applicant: LAM RESEARCH CORPORATION, Fremont, CA (US)

(72) Inventors: Liwei An, Tigard, OR (US); Ramesh Chandrasekharan, Lake Oswego, OR (US); Sergey Georgiyevich Belostotskiy, Sherwood, OR (US); Tu Hong, Tualatin, OR (US); Chunhai Ji, Portland, OR (US); Noah Elliot Baker, West Linn, OR (US)

(73) Assignee: LAM RESEARCH CORPORATION, Fremont, CA (US)

(*) Notice: Subject to any disclaimer, the term of this patent is extended or adjusted under 35 U.S.C. 154(b) by 229 days.

(21) Appl. No.: 18/707,790

(22) PCT Filed: Nov. 10, 2022

(86) PCT No.: PCT/US2022/049601
§ 371 (c)(1),
(2) Date: May 6, 2024

(87) PCT Pub. No.: WO2023/086509
PCT Pub. Date: May 19, 2023

(65) Prior Publication Data

US 2025/0022740 A1 Jan. 16, 2025

Related U.S. Application Data

(60) Provisional application No. 63/279,003, filed on Nov. 12, 2021.

(51) Int. Cl.
*H10P 72/72* (2026.01)
*H01J 37/32* (2006.01)
*H10P 72/00* (2026.01)

(52) U.S. Cl.
CPC ...... *H10P 72/722* (2026.01); *H01J 37/32935* (2013.01); *H10P 72/0616* (2026.01)

(58) Field of Classification Search
CPC ............... H10P 72/722; H10P 72/0616; H10P 72/0604; H01J 37/32935; H01J 37/32715
See application file for complete search history.

(56) References Cited

U.S. PATENT DOCUMENTS 3,931,577 A 1/1976 Barnett
5,737,177 A 4/1998 Mett et al.
(Continued)

FOREIGN PATENT DOCUMENTS

JP H10223744 A 8/1998
KR 1020110039266 A 4/2011
(Continued)

OTHER PUBLICATIONS

International Search Report and Written Opinion of the ISA issued in PCT/US2022/049601, mailed Apr. 4, 2023; ISA/KR.
(Continued)

*Primary Examiner* — Thienvu V Tran
*Assistant Examiner* — Muaamar Qahtan Al-Taweel

(57) ABSTRACT

A system for monitoring health of a pedestal of a processing chamber comprises a memory storing instructions and a processor. The processor is configured to execute the instructions to sense one or more currents through one or more electrodes arranged in the pedestal; generate one or more metrics based on the one or more currents; and determine a health of the pedestal based on the one or more metrics.

17 Claims, 6 Drawing Sheets

(56) References Cited

U.S. PATENT DOCUMENTS

| | | | | |
|---|---|---|---|---|
| 6,132,280 | A | 10/2000 | Tanabe et al. | |
| 2003/0033116 | A1 | 2/2003 | Brcka et al. | |
| 2008/0297971 | A1* | 12/2008 | Jafarian-Tehrani | H10P 72/0421 361/234 |
| 2009/0308734 | A1 | 12/2009 | Krauss | |
| 2010/0136793 | A1* | 6/2010 | Chen | H01J 37/32082 156/345.28 |
| 2010/0271744 | A1 | 10/2010 | Ni et al. | |
| 2011/0011703 | A1 | 1/2011 | Kageyama et al. | |
| 2011/0011730 | A1 | 1/2011 | Valcore, Jr. et al. | |
| 2014/0173158 | A1* | 6/2014 | Valcore, Jr. | H01J 37/32935 710/305 |
| 2014/0375299 | A1 | 12/2014 | Belostotskiy et al. | |
| 2016/0049323 | A1* | 2/2016 | Ye | H02N 13/00 361/234 |
| 2019/0172743 | A1* | 6/2019 | McIntyre | G01R 19/14 |
| 2020/0194299 | A1* | 6/2020 | Balasubramanian | H01J 37/32697 |
| 2021/0351007 | A1* | 11/2021 | Carter | H03K 3/64 |
| 2022/0367225 | A1* | 11/2022 | Herman | G06N 3/04 |

FOREIGN PATENT DOCUMENTS

| | | | |
|---|---|---|---|
| KR | 101776022 | B1 | 9/2017 |
| TW | 201349339 | A | 12/2013 |

OTHER PUBLICATIONS

Taiwanese Office Action for Taiwanese Application No. 111143153 dated Jan. 20, 2026.

* cited by examiner

SYSTEM FOR MONITORING PERFORMANCE OF ELECTROSTATIC CHUCKS IN SUBSTRATE PROCESSING SYSTEMS

CROSS-REFERENCE TO RELATED APPLICATIONS

This application is a U.S. National Phase Application under 35 U.S.C. 371 of International Application No. PCT/US2022/049601, filed on Nov. 10, 2022, which claims the benefit of U.S. Provisional Application No. 63/279,003, filed on Nov. 12, 2021. The entire disclosures of the applications referenced above are incorporated herein by reference.

FIELD

The present disclosure relates generally to substrate processing systems and more particularly to a system for monitoring performance of electrostatic chucks in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Semiconductor processing systems (also called tools) comprise processing chambers (also called stations or process modules). In the processing chambers, semiconductor substrates (also called wafers) are arranged on a pedestal (e.g., an electrostatic chuck or ESC). The ESC comprises a plurality of clamping electrodes to clamp the substrate to the ESC during processing. One or more process gases are supplied from a showerhead to the processing chamber. Plasma is struck between the showerhead and the ESC to deposit material on or to remove (etch) material from the substrate.

SUMMARY

A system for monitoring health of a pedestal of a processing chamber comprises a memory storing instructions and a processor. The processor is configured to execute the instructions to sense one or more currents through one or more electrodes arranged in the pedestal; generate one or more metrics based on the one or more currents; and determine a health of the pedestal based on the one or more metrics.

In additional features, the electrodes include clamping electrodes that clamp a substrate to the pedestal during processing of the substrate in the processing chamber.

In additional features, the processor is configured to detect, based on the one or more metrics, a degradation of the pedestal due to at least one of chemical, electrical, and thermal environment in the processing chamber.

In additional features, the processor is configured to predict a problem with the pedestal based on the one or more metrics.

In additional features, the processor is configured to predict a likelihood of occurrence of a defect in a substrate processed on the pedestal based on the one or more metrics.

In additional features, the processor is configured to detect a problem with clamping of a substrate to the pedestal based on the one or more metrics.

In additional features, the processor is configured to predict, based on the one or more metrics, a likelihood of occurrence of arcing in the processing chamber when a substrate is processed on the pedestal.

In additional features, the processor is configured to detect an imbalance in the currents based on the one or more metrics. The imbalance is indicative of a degradation of the pedestal due to at least one of chemical, electrical, and thermal environment in the processing chamber.

In additional features, the processor is configured to sense the currents during one or more processing steps performed on a substrate arranged on the pedestal.

In additional features, the processor is configured to sense the currents during at least one of the following operations performed on a substrate arranged on the pedestal: clamping the substrate to the pedestal; holding the clamped substrate on the pedestal; supplying a process gas to the processing chamber; and processing the substrate using the process gas by striking plasma in the processing chamber.

In additional features, the processor is configured to generate the one or more metrics based on at least one of averages of the currents and differences between the currents.

In additional features, the processor is configured to generate the one or more metrics based on a statistical analysis of the currents.

In additional features, the processor is configured to determine the health of the pedestal by comparing the one or more metrics to respective thresholds.

In additional features, the processor is configured to determine the respective thresholds based on data received from one or more processing chambers.

In additional features, the processor is configured to determine the health of the pedestal by comparing the one or more metrics to respective predetermined ranges.

In additional features, the processor is configured to determine the respective predetermined ranges based on data received from one or more processing chambers.

In additional features, two of the currents through two of the electrodes flow in opposite directions. At least one of the metrics detects an imbalance in the two currents. The imbalance is indicative of a degradation of the pedestal due to at least one of chemical, electrical, and thermal environment in the processing chamber.

In additional features, the directions of the currents through the two electrodes are reversed during processing of each successive substrate.

In additional features, at least one of the electrodes is exposed to plasma during processing of a substrate on the pedestal. One of the currents through the at least one of the electrodes includes a plasma component.

In additional features, the processor is configured to determine the plasma component and to offset the currents through two of the electrodes by the plasma component.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Electrostatic chucks (ESCs) are exposed to severe operating conditions in processing chambers (also called stations). For example, the ESCs are exposed to various process chemistries, high voltages (e.g., on the order of several hundred volts), and high temperatures (e.g., on the order of several hundred degrees Celsius). Over time, exposure to such harsh chemical, electrical, and thermal conditions tends to degrade and damage the ESCs. For example, the clamping ability of the ESC degrades. Due to arcing, which occurs during processing of some substrates, currents through the clamping electrodes, which are typically balanced, tend to increase and become imbalanced. These problems cause defects in substrates. Presently, no single ESC current can directly predict which substrates have a higher propensity for arcing or can signify a damaged ESC. Therefore, the problems tend to persist, and the ESCs cannot be proactively monitored and serviced to avoid these problems.

The present disclosure provides a system that solves the above problems by utilizing a plurality of metrics derived from ESC currents. The metrics help detect the current imbalance in the ESCs and indicate the health and degradation of the ESCs. The metrics provide predictions regarding probability of failure of the ESCs. Further, the metrics can also predict likelihood of defects that can occur in substrates and can identify which substrates are likely to cause arcing. These predictions can help in planning production and service. These and other features of the system of the present disclosure are described below in detail.

Figure 1:
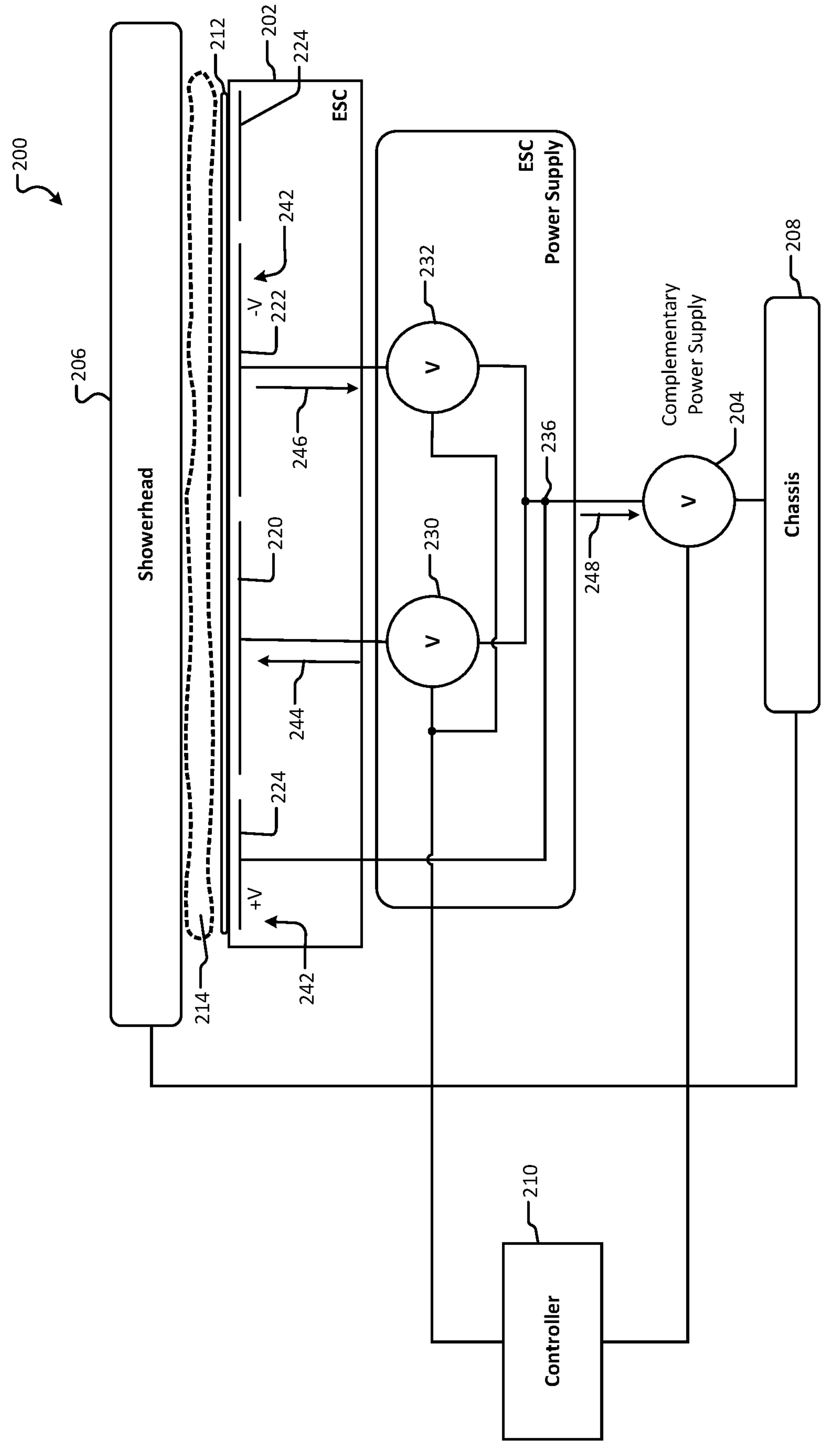
FIG. 1 shows a schematic of a processing chamber of a substrate processing system.

FIG. 1 shows a schematic of a processing chamber (station) 200 of a semiconductor processing system (tool). The station 200 comprises an electrostatic chuck ESC 202 on which a substrate 212 is arranged during processing. The ESC 202 comprises at least two clamping electrodes E1 220 and E2 222, which are also called bipolar electrodes. Some ESCs comprise a third clamping electrode called an outer electrode (OE) 224. The OE 224 is annular and surrounds the electrodes 220, 222. The electrodes 220, 222, and 224 are called tri-polar electrodes.

The station 200 comprises a showerhead 206 that supplies one or more process gases. Radio frequency (RF) power (not shown) is applied across the showerhead 206 and the ESC 202 to strike plasma 214 between the showerhead 206 and the ESC 202, and material is deposited on or removed from the substrate 212.

The ESC 202 comprises two power supplies 230, 232 that supply power to the electrodes 220, 222, respectively. A complementary power supply (CPS) 204 provides an offset to the power supplies 230, 232 based on a plasma voltage (explained below). The OE 224 is connected to a node 236 between the CPS 204 and the power supplies 230, 232. In other words, the OE 224 is connected to an output of the CPS 204, which is also connected to the inputs of the power supplies 230, 232.

The power supplies 230, 232 supply voltages 240, 242 to the electrodes 220, 222, respectively. The voltages 240, 242 are of opposite polarities. Consequently, currents 244, 246 flow through the electrodes 220, 222 in opposite directions. A current 248 flows through the OE 224 and the CPS 204, and is called a CPS current 248. An outer diameter (OD) of the OE 224 is greater than the OD of the substrate 212. Accordingly, outer portions of the OE 224 are exposed to the plasma 214, and the CPS current 248 includes a plasma component.

A controller 210 controls the power supplies 230, 232, 204. The controller 210 controls the power supplies 230, 232 independently of each other. The value of the plasma voltage, which is empirically measured, and which is fixed for a process, is stored in the controller. Based on the value of the plasma voltage, the CPS 204 supplies an offset to the power supplies 230, 232. The controller 210 switches the polarities of the voltages 240, 242 supplied to the electrodes 220, 222 after processing each substrate. Accordingly, the directions of the currents 244, 246 are also reversed after processing each substrate.

Over time, due to harsh chemical (various process chemistries), electrical (high voltages and currents), and thermal environment (high temperatures) in the station, the ESC 202 tends to wear. For example, arcing occurs during processing of some substrates. Arcing affects the currents 244, 246, 248 (collectively called the ESC currents), and the clamping ability of the ESC 202 degrades. Currents 244, 246, which are typically balanced, tend to increase and become imbalanced, which tends to cause substrate non-uniformity. In the current state of the art, no single current can directly predict which substrates have a greater propensity for arcing or can signify a damaged ESC.

The present disclosure provides a system that provides metrics derived from the ESC currents. The metrics detect the current imbalance and indicate a state of health of the ESC 202 (e.g., whether the ESC 202 is operating normally or is degrading). Thresholds and/or threshold ranges for the metrics are empirically determined based on data collected from stations in several tools. In use, the metrics are computed (e.g., by the controller 210) from the ESC currents sensed in the station 200. The computed metrics are compared to the respective thresholds or threshold ranges. The health of the ESC 202 is determined based on the comparisons. Predictions regarding a level of degradation of the ESC 202 and an estimate of remaining useful life of the ESC 202 are also provided based on the comparisons. The predictions help in planning production and service as explained below. Further, the metrics can also predict which substrates are likely to cause arcing.

Figure 2:
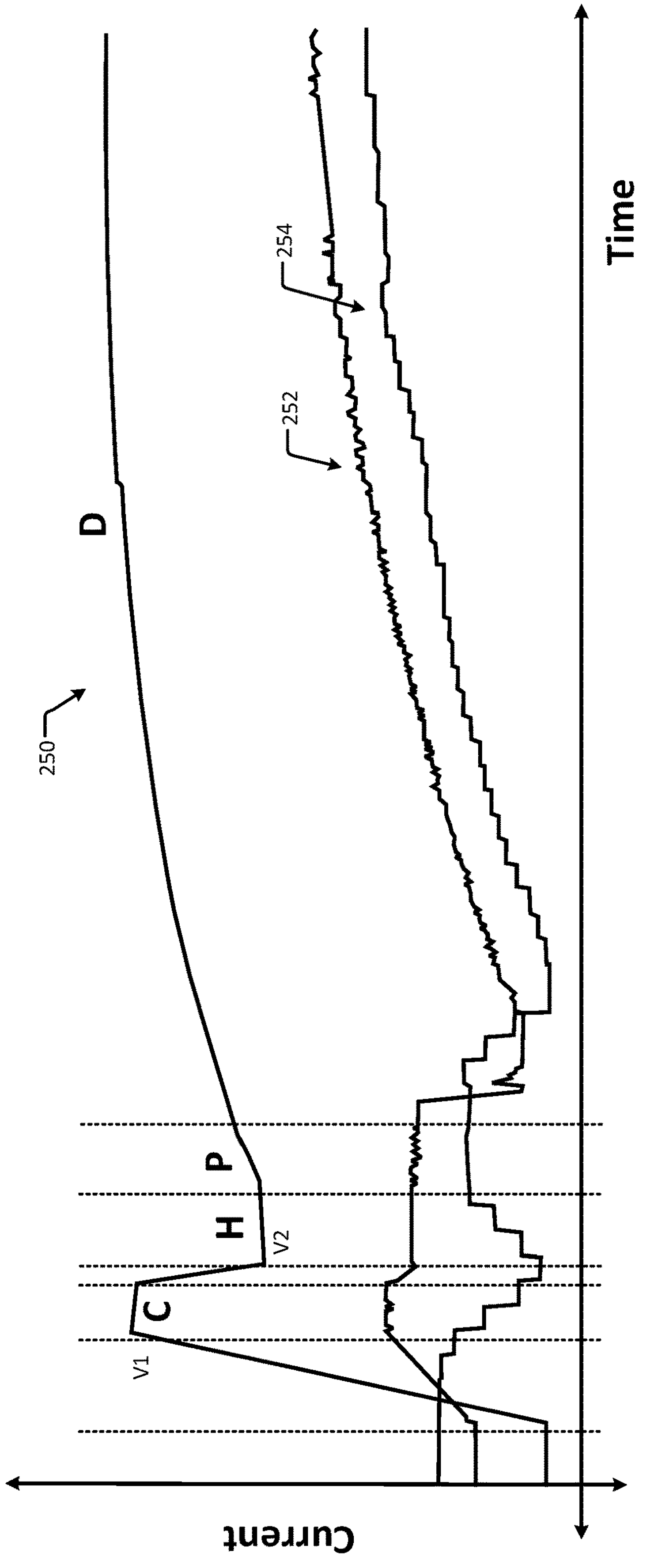
FIG. 2 shows a graph of several currents sensed in an electrostatic chuck (ESC) of the processing chamber of FIG. 1.

FIG. 2 shows examples of process steps that are typically performed on the substrate 212. The process steps described below are performed sequentially in the described sequence. In a clamping step C, a voltage V1 is applied to the clamping electrodes. In a hold step H, the voltage applied to the clamping electrodes is reduced from V2 to V1 to hold the substrate 212 clamped to the ESC 202. In step P, one or more process gases are supplied through the showerhead 206. In step D, plasma is struck by applying RF power across the showerhead 206 and the ESC 202, and material is deposited on or removed from the substrate 212. Step D is typically of a longer duration than steps C, H, and P.

In FIG. 2, a difference between the currents 244, 246 during the steps C, H, P, and D is shown at 250. An average of the currents 244, 246 during the steps C, H, P, and D is shown at 252. The CPS current 248 during the steps C, H, P, and D is shown at 254.

Referring to FIGS. 3A-6F various metrics that indicate the health of the ESC 202 and predict degradation and failure of the ESC 202 are defined. Initially, the definitions of the metrics are described. Subsequently, the calculation of the thresholds for the metrics and the use of the metrics to indicate the health of the ESC 202 and to predict degradation and failure of the ESC 202 are explained.

Some of FIGS. 3A-6F show abbreviated and simplified versions of the curves shown in FIG. 2. In FIGS. 3A-6F and their description, the nomenclature C, H, P, and D of the steps is maintained. In some instances, terms Clamp, Hold, and Dep are explicitly used to denote steps C, H, and D, respectively; and the term Sup is used instead of P to denote the process gas supply step. Further, in the formulae for the metrics, notations A, B, and CPS are used to denote currents 244, 246, and 248, respectively. Notations ave and diff are used to denote average and difference values, respectively.

Referring to FIGS. 3A-3D, the curves shown are similar to the curve shown at 252 in FIG. 2. The curves show the average values of the ESC currents 244, 246 during steps C, H, P, and D. A metric M1 is defined as follows.

Figure 3A:
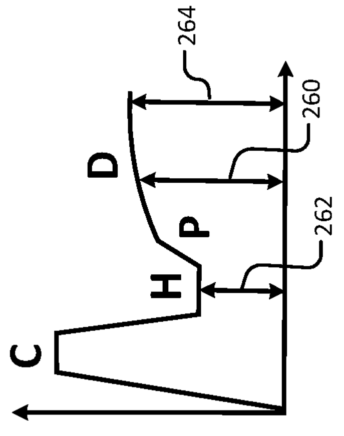
FIGS. 3A-3D show average currents sensed in the ESC for computing metrics that can indicate health and predict a failure of the ESC.

Referring to FIG. 3A, metric M1=(Mean($I_{ABave}$[Dep])−Mean($I_{ABave}$[Hold]))/Mean($I_{ABave}$[Hold])

where $I_{ABave}$[Dep] is an average value of the currents 244, 246 during step D (shown at 260), and $I_{ABave}$[Hold] is a mean value of the average value of the currents 244, 246 during step H (shown at 262). Metric M1 indicates changes induced by the plasma 214 in the currents 244, 246.

Metric M1 can also be alternatively formulated as follows.

$$M1=(\mathrm{Max}(I_{ABave}[\mathrm{Dep}])-\mathrm{Mean}(I_{ABave}[\mathrm{Hold}]))/\mathrm{Mean}(I_{ABave}[\mathrm{Hold}])$$

where Max($I_{ABave}$[Dep]) is a maximum value of the average of the currents 244, 246 during step D (shown at 264), and $I_{ABave}$[Hold] is a mean value of the average of the currents 244, 246 during step H (shown at 262).

Alternatively, M1=Mean($I_{ABave}$[Dep])−Mean($I_{ABave}$[Hold]). The terms are defined above.

As another alternative, M1=Max($I_{ABave}$[Dep])−Mean($I_{ABave}$[Hold]). The terms are defined above.

Figure 3B:
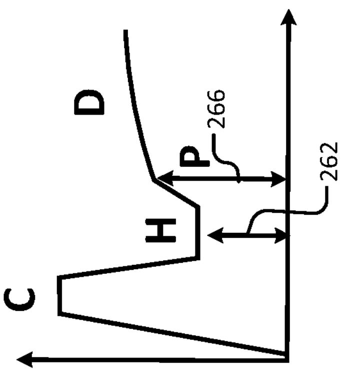

Referring to FIG. 3B, a metric M2 is defined as follows.

$$M2=((\mathrm{Max}(I_{ABave}[\mathrm{Sup}])-\mathrm{Mean}(I_{ABave}[\mathrm{Hold}]))/\mathrm{Mean}(I_{ABave}[\mathrm{Hold}])$$

where Max($I_{ABave}$[Sup]) is a maximum value of the average values of the currents 244, 246 during step P (shown at 266), and $I_{ABave}$[Hold] is a mean value of the average of the currents 244, 246 during step H (shown at 262). Metric M2 indicates relative maximum values of the ESC currents 244, 246 in step P.

Metric M2 can also be alternatively formulated as follows.

M2=Max($I_{ABave}$[Sup])−Mean($I_{ABave}$[Hold]). The terms are defined above.

Figure 3C:
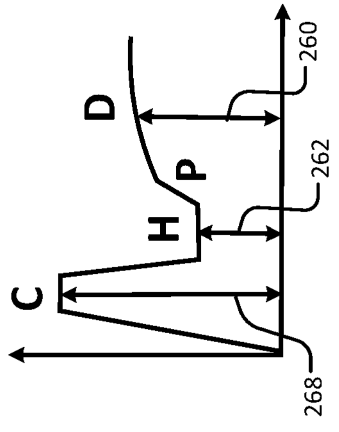

Referring to FIG. 3C, a metric M3 is defined as follows.

M3=Mean($I_{ABave}$[Clamp]) or Mean (ABave [Hold]) or Mean($I_{ABave}$[Dep]), which are mean values of the average of the currents 244, 246 during steps C, H, and D, respectively (shown at 268, 262, and 260, respectively).

Figure 3D:
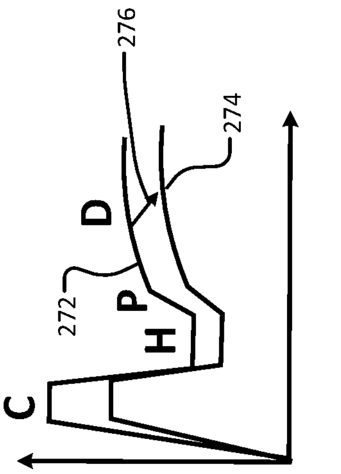

Referring to FIG. 3D, a first curve 272 shows the average values of the currents 244, 246 during processing of a first substrate. A second curve 274 shows the average values of the currents 244, 246 during subsequent processing of a second substrate. During the processing of the second substrate, the ESC currents 244, 246 are reversed relative to the processing of the first substrate as explained above with reference to FIG. 1.

A shift in Mean($I_{ABave}$[Dep]), which is a mean value of the average value of the currents 244, 246 during step D, from the processing of the first substrate to the second substrate is shown at 276. If Mean($I_{ABave}$[Dep]) decreases as shown (downwards), a slope of Mean($I_{ABave}$[Dep]) is negative, which indicates that the ESC 202 is operating normally (or is healthy). If Mean($I_{ABave}$[Dep]) increases (e.g., shifts in the opposite direction than the direction shown—upwards versus downwards), the slope of Mean($I_{ABave}$[Dep]) is positive, which indicates that the ESC 202 is degrading. Accordingly, another metric can be defined as Slope of Mean($I_{ABave}$[Dep]) that can indicate the health of the ESC 202 and predict degradation and failure of the ESC 202.

Figure 4A:
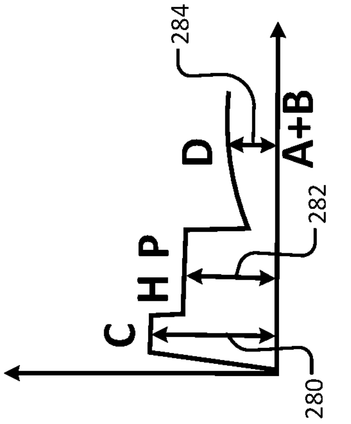
FIGS. 4A-4D show differences in the currents sensed in the ESC for computing additional metrics that can indicate health and predict a failure of the ESC.
Figure 4B:
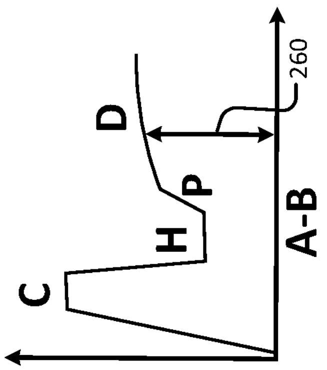

Referring to FIGS. 4A-4D, the curves shown are similar to the curve shown at 250 in FIG. 2. The curves show the differences in the ESC currents 244, 246 during steps C, H, P, and D. FIG. 4A shows the difference in absolute values (excluding the opposite polarities) of the currents 244, 246 (shown as A+B). FIG. 4B shows the difference in actual values (including the opposite polarities) of the currents 244, 246 (shown as A-B).

Referring to FIG. 4A, a metric M4 is defined as follows.

M4=Mean($I_{ABdiff}$[Clamp]) or Mean($I_{ABdiff}$[Hold]) or Mean ($I_{ABdiff}$[Dep]), which are mean values of differences in absolute values of the currents 244, 246 during steps C, H, and D, respectively (shown at 280, 282, and 284, respectively). The metric M4 provides the differences in the ESC currents in steps C, H, and D.

Alternatively, referring to FIGS. 4A and 4B, the metric M4 can also be formulated as follows.

M4=Mean($I_{ABdiff}$[Dep])/Mean($I_{ABave}$[Dep]). Both terms are defined above.

Figure 4C:
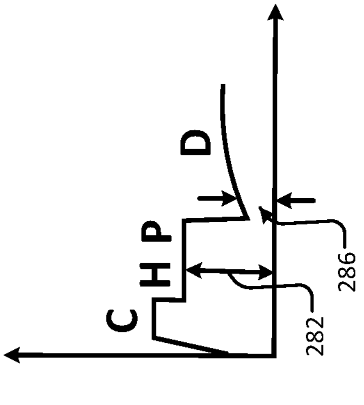

Referring to FIG. 4C, the metric M4 can also be defined as follows.

$$M4=\mathrm{Max}(I_{ABdiff}[\mathrm{Dep}],\text{first } T \text{ time units})-\mathrm{Mean}(I_{ABdiff}[\mathrm{Hold}])$$

where Max($I_{ABdiff}$[Dep], first T time units) is a maximum value of $I_{ABdiff}$[Dep] in first T time units (e.g., 10 seconds) from the start of step D (shown at 286), and $I_{ABdiff}$[Hold] is a mean value of the difference in absolute values of the currents 244, 246 during step H (shown at 282). This metric indicates a relative maximum value of the difference in the ESC currents in the first T time units of step D.

Figure 4D:
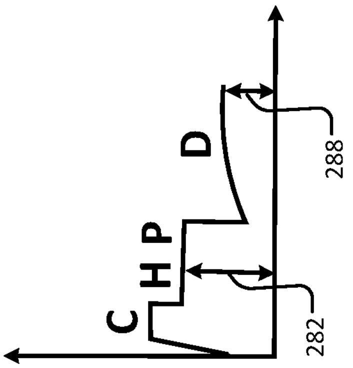

Referring to FIG. 4D, the metric M4 can also be defined as follows.

$$M4=\mathrm{Mean}(I_{ABdiff}[\mathrm{Dep}],\text{last } T \text{ time units})-\mathrm{Mean}(I_{ABdiff}[\mathrm{Hold}])$$

where Mean($I_{ABdiff}$[Dep], last T time units) is a mean value of $I_{ABdiff}$[Dep] in the last T time units (e.g., 10 seconds) before the end of step D (shown at 288), and $I_{ABdiff}$[Hold] is a mean value of the difference in absolute values of the currents 244, 246 during step H (shown at 282). This metric indicates a relative mean value of the difference in the ESC currents in the last T time units of step D.

Referring to FIGS. 5A-5F, the curves shown are similar to the curve shown at 254 in FIG. 2. The curve shows the CPS current 248 during steps C, H, P, and D.

Figure 5C:
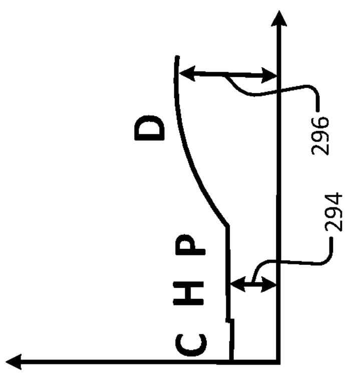
FIGS. 5A-5F show a current through a complementary power supply used with the ESC for computing additional metrics that can indicate health and predict a failure of the ESC.
Figure 5B:
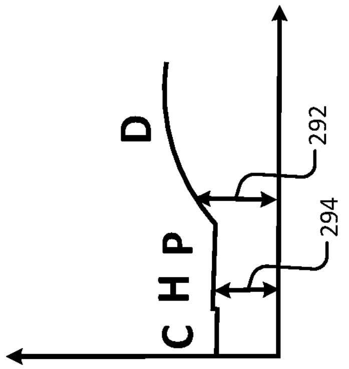
Figure 5A:
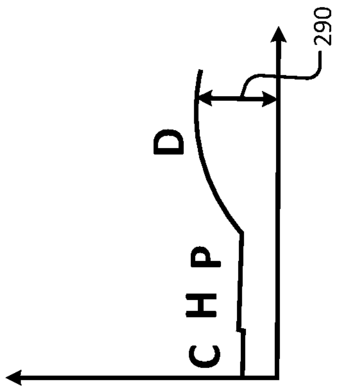

Referring to FIG. 5A a metric M5 can be defined as follows.

M5=Max($I_{CPS}$[Dep]), which is a maximum value of the CPS current 248 in step D (shown at 290).

Figure 5F:
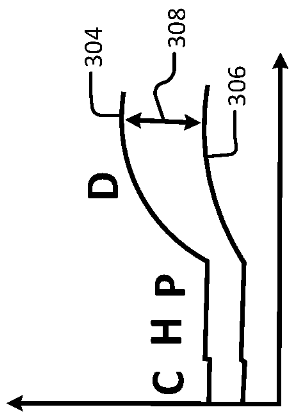
Figure 5E:
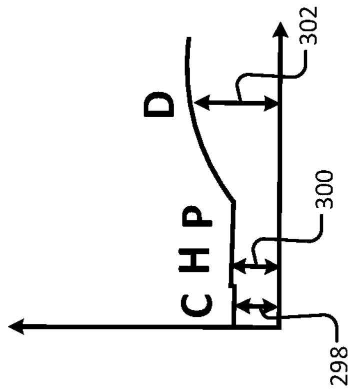
Figure 5D:
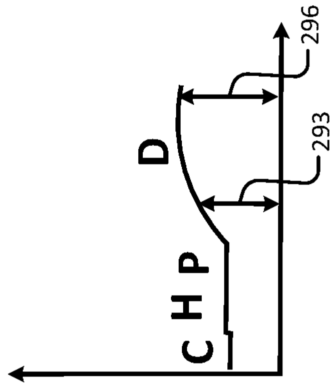

Referring to FIGS. 5B-5D, the metric M5 can also be defined as follows.

Referring to FIG. 5B, M5=Max($I_{CPS}$[Dep], first T time units)−Mean($I_{CPS}$[Hold])

where Max($I_{CPS}$[Dep], first T time units) is a maximum value of the CPS current 248 in first T time units (e.g., 10 seconds) from the start of step D (shown at 292), and Mean($I_{CPS}$[Hold]) is a mean value of the CPS current 248 during step H (shown at 294). This metric indicates a relative maximum value of the CPS current 248 in the first T time units of step D.

Referring to FIG. 5C, M5=Mean($I_{CPS}$[Dep], last T time units)−Mean($I_{CPS}$[Hold])

where Mean($I_{CPS}$[Dep], last T time units) is a mean value of $I_{CPS}$[Dep] in the last T time units (e.g., 10 seconds) before the end of step D (shown at 296), and Mean ($I_{CPS}$[Hold]) is defined above. This metric indicates a relative mean value of the CPS current 248 in the last T time units of step D.

Referring to FIG. 5D, M5=Max($I_{CPS}$[Dep], first T1 time units)−Mean($I_{CPS}$[Dep], last T2 time units), where T1≥T2; Max($I_{CPS}$[Dep], first T1 time units) is a maximum value of the CPS current 248 in first T1 time units (e.g., 90 seconds) from the start of step D (shown at 293); and Mean($I_{CPS}$ [Dep], last T2 time units) is a mean value of $I_{CPS}$[Dep] in the last T2 time units (e.g., 10 seconds) before the end of step D (shown at 296). This metric indicates a difference between a maximum value of the CPS current 248 in first T1 time units (e.g., 90 seconds) from the start of step D (shown at 293) and a mean value of CPS current 248 in the last T2 time units (e.g., 10 seconds) before the end of step D (shown at 296).

Referring to FIGS. 5E and 5F, metric M5 can be defined in additional ways as follows.

Referring to FIG. 5E, M5=Mean($I_{CPS}$[Clamp]) or Mean ($I_{CPS}$[Hold]) or Mean($I_{CPS}$[Dep]), which are mean values of the CPS current 248 during steps C, H, and D, respectively (shown at 298, 300, and 302, respectively). These values of the metric M5 are indicative of current between the OE 224 and the substrate 212 in steps C, H, and D.

Referring to FIG. 5F, a first curve 304 shows the CPS current 248 during processing of a first substrate. A second curve 306 shows the CPS current 248 during subsequent processing of a second substrate. During the processing of the second substrate, the ESC currents 244, 246 are reversed relative to the processing of the first substrate as explained above with reference to FIG. 1. A difference in Max($I_{CPS}$ [Dep]), which is the maximum value of the CPS current 248 during step D, from the processing of the first substrate to the second substrate is shown at 308. Accordingly, another metric can be defined as Split (Max($I_{CPS}$[Dep])), which is the difference or the split of the maximal $I_{CPS}$ when the currents 244, 246 are reversed. This metric can indicate the health of the ESC 202 and to predict degradation and failure of the ESC 202.

Thresholds and/or threshold ranges for all of the above metrics are calculated empirically based on data collected from several tools. The thresholds and/or threshold ranges are stored in the controller 210. The metrics and the respective thresholds and/or threshold ranges for the metrics are process-specific. In use, the controller 210 senses the currents 244, 246, 248, and computes any of the metrics described above. The controller 210 compares the metrics to the respective thresholds and/or threshold ranges. Based on the comparisons, the controller 210 determines the health of the ESC 202 and predicts a level of degradation and likelihood of failure (e.g., estimated remaining useful life) of the ESC 202. The metrics can also predict a likelihood of occurrence of arcing. For example, the metrics can predict which substrates are more likely to cause arcing. The metrics can also predict a likelihood of occurrence of defects on substrates processed using the USC 202.

Note that not all of the metrics need be used. Due to the averages, differences, and statistical parameters used in formulating the various metrics described above, there can be overlap in some of the metrics. Further, some of the metrics may be more reliable than others in indicating the health and predicting failures of the ESCs. Accordingly, only selected metrics (e.g., those more reliable than others) may be used to determine the health and probability of failure of an ESC. Further, one set of metrics may be used for some ESCs, while another set of metrics may be used for other ESCs. The metrics can be selected and utilized in other ways.

In some implementations, the thresholds may be scaled or graded. The following description for the thresholds in this paragraph also applies to threshold ranges. For example, the thresholds for some of the metrics may have three successively increasing values. When a metric exceeds a first (lowest) threshold, a simple alert is issued. When a metric exceeds a second threshold that is greater than the first threshold, a more severe warning than the simple alert is issued. In response to the more severe warning, production and service can be planned. For example, some production (substrates to be processed) can be diverted to another station or tool with a healthy ESC, and service for the problematic ESC can be scheduled. When a metric exceeds a third (highest) threshold that is greater than the second threshold, a most severe warning is issued. In response to the most severe warning, all production is diverted to another station or tool with a healthy ESC, and the problematic ESC is serviced. In implementations using a single threshold, when a metric exceeds the threshold, a warning is issued, production can be diverted to another station or tool with a healthy ESC, and the problematic ESC can be serviced.

Figure 6:
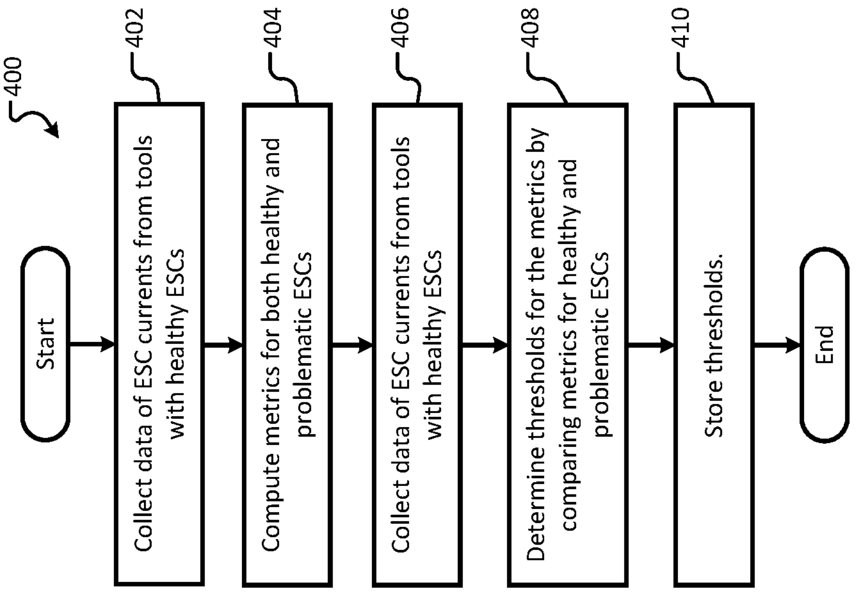
FIG. 6 shows a method for computing thresholds and threshold ranges for the metrics.

FIG. 6 shows a method 400 of calculating thresholds and threshold ranges for the metrics. At 402, the method 400 collects measurements of the ESC currents from several tools in which the ESCs are known to be healthy. At 404, the method 400 collects measurements of the ESC currents from several tools in which the ESCs are known to be having problems. At 406, the method 400 computes the metrics for both healthy and problematic ESCs. At 408, the method 400 determines thresholds and threshold ranges for the metrics by comparing the metric values computed for both healthy and problematic ESCs. At 410, the method 400 stores the thresholds and threshold ranges for the metrics, and the method 400 ends.

Figure 7:
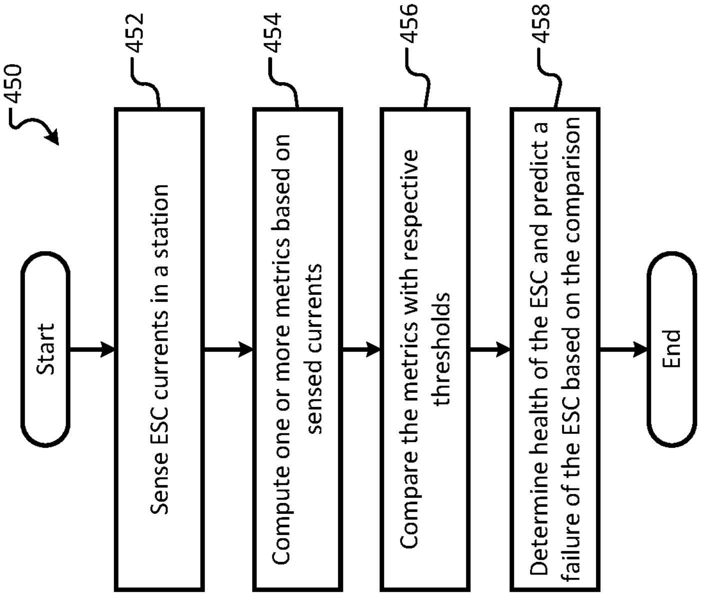
FIG. 7 shows a method for determining the health of the ESC and predicting a failure of the ESC based on the metrics and the respective thresholds and threshold ranges.

FIG. 7 shows a method 450 for determining the health of ESCs and predicting problems with the ESCs. At 452, the method 450 senses the ESC currents in a station. At 454, the method 450 computes one or more metrics based on the sensed currents. At 456, the method 450 compares one or more of the metrics with respective thresholds or threshold ranges. At 458, the method 450 determines the health of the ESC and predicts a probability of a failure of the ESC, a probability of occurrence of arcing, a probability of defects occurring in a substrate, and which substrate is more likely to cause arcing, based on the comparisons, and the method 450 ends.

The system and the methods described above can be implemented in the controller 210 or can be implemented in a cloud and deployed as software-as-a-service, or can be implemented using a combination of both the controller 210 and a server in the cloud. In the cloud based implementation, the controller 210 may only perform current sensing. The data of the sensed currents can be transmitted to the server in the cloud via a distributed communication system such as the Internet and/or other suitable network or networks. In the server, the metrics are computed and compared to the respective thresholds and/or threshold ranges. Based on the comparisons, the controller 210 can receive indications of the health of the ESC and the predictions from the server via the distributed communication system. The indications and predictions can also be transmitted from the server or the controller 210 to other computing devices including but not limited to mobile devices of operators of the tools.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including “connected,” “engaged,” “coupled,” “adjacent,” “next to,” “on top of,” “above,” “below,” and “disposed.” Unless explicitly described as being “direct,” when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean “at least one of A, at least one of B, and at least one of C.”

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the “controller,” which may control various components or subparts of the system or systems.

The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the “cloud” or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system for monitoring health of a pedestal of a processing chamber, the system comprising:
- a memory storing instructions; and
- a processor configured to execute the instructions to:
  - sense currents through one or more electrodes arranged in the pedestal;
  - generate a plurality of metrics based on a statistical analysis of the currents, the statistical analysis comprising generating averages of the currents and differences between the currents, and comprising generating maximum and mean values based on the averages and differences;
  - select a set of metrics from the plurality of metrics based on a type of the pedestal for determining a health of the pedestal; and
  - determine the health of the pedestal by comparing the selected set of metrics to respective thresholds.

2. The system of claim 1 wherein the electrodes include clamping electrodes that clamp a substrate to the pedestal during processing of the substrate in the processing chamber.

3. The system of claim 1 wherein the processor is configured to detect, based on the selected set of metrics, a degradation of the pedestal due to at least one of chemical, electrical, and thermal environment in the processing chamber.

4. The system of claim 1 wherein the processor is configured to predict a problem with the pedestal based on the selected set of metrics.

5. The system of claim 1 wherein the processor is configured to predict a likelihood of occurrence of a defect in a substrate processed on the pedestal based on the selected set of metrics.

6. The system of claim 1 wherein the processor is configured to detect a problem with clamping of a substrate to the pedestal based on the selected set of metrics.

7. The system of claim 1 wherein the processor is configured to predict, based on the selected set of metrics, a likelihood of occurrence of arcing in the processing chamber when a substrate is processed on the pedestal.

8. The system of claim 1 wherein the processor is configured to detect an imbalance in the currents based on the selected set of metrics and wherein the imbalance is indicative of degradation of the pedestal due to at least one of chemical, electrical, and thermal environment in the processing chamber.

9. The system of claim 1 wherein the processor is configured to sense the currents during one or more processing steps performed on a substrate arranged on the pedestal.

10. The system of claim 1 wherein the processor is configured to sense the currents during at least one of the following operations performed on a substrate arranged on the pedestal:
- clamping the substrate to the pedestal;
- holding the clamped substrate on the pedestal;
- supplying a process gas to the processing chamber; and
- processing the clamped substrate using the process gas by striking plasma in the processing chamber.

11. The system of claim 1 wherein the processor is configured to determine the respective thresholds based on data received from a plurality of processing chambers of a plurality of tools.

12. The system of claim 1 wherein the processor is configured to determine the health of the pedestal by comparing the selected set of metrics to respective predetermined ranges.

13. The system of claim 12 wherein the processor is configured to determine the respective predetermined ranges based on data received from a plurality of processing chambers of a plurality of tools.

14. The system of claim 1 wherein two of the currents through two of the electrodes flow in opposite directions, wherein at least one of the metrics detects an imbalance in the two currents, and wherein the imbalance is indicative of a degradation of the pedestal due to at least one of chemical, electrical, and thermal environment in the processing chamber.

15. The system of claim 14 wherein directions of the currents through the two electrodes are reversed during processing of each successive substrate.

16. The system of claim 1 wherein at least one of the electrodes is exposed to plasma during processing of a substrate on the pedestal and wherein one of the currents through the at least one of the electrodes includes a plasma component.

17. The system of claim 16 wherein the processor is configured to determine the plasma component and to offset the currents through two of the electrodes by the plasma component.

* * * * *